(12) United States Patent
Parris et al.

(10) Patent No.: US 9,873,833 B2
(45) Date of Patent: Jan. 23, 2018

(54) ETCHANT SOLUTIONS AND METHOD OF USE THEREOF

(71) Applicant: Air Products and Chemicals, Inc., Allentown, PA (US)

(72) Inventors: Gene Everad Parris, Coopersburg, PA (US); William Jack Casteel, Jr., Emmaus, PA (US); Tianniu Rick Chen, Westford, MA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 14/978,383

(22) Filed: Dec. 22, 2015

(65) Prior Publication Data

US 2016/0186058 A1 Jun. 30, 2016

Related U.S. Application Data

(60) Provisional application No. 62/097,408, filed on Dec. 29, 2014.

(51) Int. Cl.
*B44C 1/22* (2006.01)
*C03C 15/00* (2006.01)
(Continued)

(52) U.S. Cl.
CPC ........ *C09K 13/02* (2013.01); *H01L 21/30608* (2013.01); *H01L 21/76898* (2013.01)

(58) Field of Classification Search
USPC .......................................................... 216/99
See application file for complete search history.

(56) References Cited

U.S. PATENT DOCUMENTS 3,980,587 A * 9/1976 Sullivan ................... C11D 7/06
134/38
2001/0048142 A1 12/2001 Urakami et al.
(Continued)

FOREIGN PATENT DOCUMENTS

EP      2355138 A1    8/2011
JP      03201533      9/1991
(Continued)

OTHER PUBLICATIONS

Prakash, A. A. B., et al., "A Review of Various Wet Etching Techniques Used in Micro Fabrication for Real Estate Consumption", International Journal of Computer Applications, "ICIIIOSP-2013", pp. 26-31.

*Primary Examiner* — Roberts Culbert
(74) *Attorney, Agent, or Firm* — Anne B. Kiernan

(57) ABSTRACT

Etching compositions and method of using the etching compositions comprising potassium hydroxide; one or more than one additional alkaline compounds selected from the group consisting of TEAH, TMAF and $NH_4OH$; and water; or etching compositions comprising one or more than one inorganic alkali basic hydroxides selected from the group consisting of potassium hydroxide, cesium hydroxide, sodium hydroxide, rubidium hydroxide, or lithium hydroxide; optionally one or more than one additional alkaline compounds; water; and optionally one or more corrosion inhibitors; wherein the composition preferentially etches silicon present on a substrate as compared to silicon dioxide present on said substrate.

24 Claims, 1 Drawing Sheet

(51) Int. Cl.
  *C03C 25/68* (2006.01)
  *C23F 1/00* (2006.01)
  *C25F 3/00* (2006.01)
  *C09K 13/02* (2006.01)
  *H01L 21/306* (2006.01)
  *H01L 21/768* (2006.01)

(56) References Cited

U.S. PATENT DOCUMENTS

| | | |
|---|---|---|
| 2009/0001315 A1 | 1/2009 | Ishikawa |
| 2009/0218542 A1 | 9/2009 | Isami et al. |
| 2010/0090158 A1 | 4/2010 | Ishikawa et al. |
| 2011/0062376 A1 | 3/2011 | Reiss et al. |
| 2012/0190210 A1 | 7/2012 | Fujioto et al. |
| 2012/0252212 A1 | 10/2012 | Nishida |
| 2014/0001145 A1 | 1/2014 | Mizutani et al. |

FOREIGN PATENT DOCUMENTS

| | | |
|---|---|---|
| JP | 09246234 | 9/1997 |
| JP | 2003257927 | 9/2003 |
| JP | 2007214456 | 8/2007 |
| JP | 2014236131 | 12/2014 |

* cited by examiner

ETCHANT SOLUTIONS AND METHOD OF USE THEREOF

The present invention claims priority to provisional application U.S. 62/097408 filed 29 Dec. 2014 having the same title; the provisional application is fully incorporated herein by reference.

BACKGROUND OF THE INVENTION

The present invention is directed to compositions and methods for cleaning microelectronic structures. In particular, the present invention is directed to stripping silicon from complex substrate surfaces that comprise Si wafers, Through Silicon Vias (TSVs), and passivation layers. The silicon wafers may have resistivities that vary from 0.02 Ohm-cm to 100 ohm-cm. The TSVs are protected by typical passivation layers comprising TaN, SiN, TiN, and SiO2.

During the production of microelectronic devices, there are primarily three types of "interconnects" that are employed in the packaging process, wherein the silicon die interfaces with the "outside" world, as well as to other die. These are wire bonding, the use of bumps, and the use of TSVs. The third method involving the use of TSVs is the focus of this application. TSVs are used to attach a device to one or more functional devices or to attach multiple device types to a carrier.

The use of TSVs is a key manufacturing option to shrink device size based on 3D Integrated Circuits (ICs). TSVs are currently used in sensors but semiconductor manufacturing companies are starting to produce semiconductor devices such as 3D stacked DRAMs, and two or more devices in a very thin package that may be useful in mobile phones, for example. The manufacture of devices containing 3D memory and logic integrated in memory in a very compact structure is also the object of this invention.

TSV process steps add cost to the devices. A typical TSV process flow may include one or more of the following steps: (1) a wafer thinning step, (2) a Si etch method to make the TSVs, (3) one or more passivation steps by PECVD to act as baffler, (4) filling the TSV with copper; (5) a CMP step to thin the opposite side of the wafer etched in step (2); (6) a dry etch TSV reveal step using Si etchant gases, and (6) a wet cleans step to strip etch residues.

It is, therefore, highly desirable to provide Si etchant and/or stripping compositions that would replace the dry etch and wet cleans steps with an etchant solution that provides ones or more of the following benefits: has high Si etch rates, low passivation etch, low surface roughness for Si after wet etch, and exhibits high bath loading.

BRIEF SUMMARY OF THE INVENTION

The present invention satisfies this need to provide Si etchant and/or stripping compositions that would replace the dry etch and wet cleans steps with an etchant solution that provides one or more of the following benefits: has high Si etch rates, low passivation etch, low surface roughness for Si after wet etch, and exhibits high bath loading. Therefore, this invention provides an etching composition comprising potassium hydroxide; one or more than one additional alkaline compounds selected from the group consisting of TEAH, TMAF and $NH_4OH$; and water; wherein the composition preferentially etches silicon present on a substrate as compared to silicon dioxide present on said substrate. This invention also provides an etching composition comprising: one or more than one inorganic alkali basic hydroxides selected from the group consisting of potassium hydroxide, cesium hydroxide, sodium hydroxide, rubidium hydroxide, or lithium hydroxide; optionally one or more than one additional alkaline compounds; and water; wherein the composition preferentially etches silicon present on a substrate as compared to silicon oxide, more commonly silicon dioxide (SiO2), present on said substrate. The one or more inorganic alkali basic hydroxides of any of the etchant compositions of this invention may be potassium hydroxide or cesium hydroxide, or potassium hydroxide and cesium hydroxide, or potassium hydroxide and lithium hydroxide.

In other aspects of the invention, any of the one or more than one additional alkaline compound may comprise one or more quaternary ammonium compounds or ammonium hydroxide (NH4OH) and in some embodiments the quaternary ammonium compounds may be quaternary ammonium fluorides or hydroxides. The quaternary ammonium compounds, in any of the compositions described above, may be selected from the group consisting of tetraalkylammonium hydroxide or tetraalkylammonium fluorides, or benzytrialkylammonium hydroxides, or they may be selected from the group consisting of tetramethyl ammonium hydroxide (TMAH), tetraethylammonium hydroxide (TEAH), ethyltrimethylammonium hydroxide (ETMAH), dimethyldipropylammonium hydroxide (DMDPAH), tetramethylammonium fluoride (TMAF), benzytrimethyl ammonium hydroxide (Triton B), and choline hydroxide, or selected from tetraethylammonium hydroxide (TEAH), ethyltrimethylammonium hydroxide (ETMAH), dimethyldipropylammonium hydroxide (DMDPAH), tetramethylammonium fluoride (TMAF) ammonium hydroxide (NH4OH), benzytrimethyl ammonium hydroxide (Triton B), and choline hydroxide, or selected from the group consisting of tetramethylammonium fluoride (TMAF) and ammonium hydroxide (NH4OH) or tetraethylammonium hydroxide (TEAH), ethyltrimethylammonium hydroxide (ETMAH) and dimethyldipropylammonium hydroxide (DMDPAH), benzytrimethyl ammonium hydroxide (Triton B), choline hydroxide and mixtures and others.

Any of the above described etchant compositions may comprise from 0.5 to 25 or 0.5 to 20, or 1 to 20 or 2 to 16 total wt % of the one or more inorganic alkali basic hydroxides based on the total composition (or any of the other ranges described below for the inorganic alkali basic hydroxides). Any of the above described etchant compositions may comprise from 0.1 to 5 or 0.2 to 3 wt or 0.5 to 2 total wt % or from greater than 0.1 to less than 5 total wt % of the one or more additional alkaline compounds. Any of the above described etchant compositions may comprise water from greater than 70 wt %, or from 70 to 99, or from 90 to 98 wt % based on the total weight of the composition (or any of the other ranges described herein for water). This invention further provides any of the etchant compositions wherein the ratio of the total weight percentage of the one or more additional alkaline compounds to the total of the weight percentage one or more inorganic alkali basic hydroxides is from 0.05 to 2.0 or from 0.05 to 1.5 or from 0.05 to 1.0 or from 0.03 to 0.8 or from 0.05 to 0.8 or from 0.07 to 0.8 or from 0.1 to 0.8. Any of the etchant compositions may comprise potassium hydroxide and cesium hydroxide where the cesium hydroxide to potassium hydroxide weight ratio is from more than 0.6 to less than 20, or more than 1.1 to less than 20, or more than 2.5 to less than 20 times, or more than 5 to less than 20 times, or more than 10 to less than 20 times.

This invention provides etchant compositions comprising potassium hydroxide and cesium hydroxide where the cesium hydroxide is present in the composition from 1 to 15 wt %, or 1 to 10 wt %, or 1 to 9.5 wt %, or 1 to 5 wt %, or 0.5 to 1.3 wt % and the potassium hydroxide is present in the composition from 1 to 15 wt %, or 1 to 10 wt %, or from 1 to 7 wt %, or from 1 to 5 wt %, or from 1 to 2 wt %, or from 0.1 to 2 wt %, or from 0.1 to 1.5 wt %, or from 0.5 to 1.3 wt %, or from 0.7 to 1.2 wt % (in any combination of those ratios and in any combination with the other aspects of the invention described herein). Further the etchant composition alone or with other aspects of the invention may comprise cesium hydroxide and potassium hydroxide and the ratio of cesium hydroxide to potassium hydroxide is from 0.5 to 10 or from 1 to 10, or from 2 to 9, or from 0.5 to 8, or from 2 to 8, or from 3 to 8.

Any of the etchant compositions may further comprise one or more optional ingredients including surfactants, chelating agents, oxidizing agents, solvents, and corrosion inhibitors in any combination as listed herein.

This invention further provides a method of producing a silicon substrate, the method comprising: forming a silicon dioxide film on a silicon substrate, said silicon dioxide film having at least one opening in said silicon dioxide film on at least one surface of the silicon substrate; etching the silicon substrate at the at least one opening by using the composition of any of the preceding claims whereby said silicon dioxide film acts as a mask. The method can be used for forming a through silicon via. The method may further comprise the step of layering a titanium nitride film on the silicon dioxide film, said titanium nitride film also formed with at least one opening, at least one of said at least one titanium nitride openings and at least one of said at least one silicon dioxide openings being aligned or further comprise the step of layering a tantalum nitride film on the silicon dioxide film, said tantalum nitride film also formed with at least one opening, at least one of said at least one titanium nitride openings and at least one of said at least one silicon dioxide openings being aligned.

Any of the previous methods may further comprise prior to the first etching step, a second etching step to form one or more holes in said silicon substrate wherein said one or more holes do not protrude through the surface of the silicon substrate; and wherein during said first etching step said one or more holes are aligned with the at least one opening in said silicon dioxide film formed on said silicon substrate. This invention provides any of the prior methods wherein the one or more holes are filled with copper before or after the first etching step and any of the prior methods wherein the one or more holes are filled with copper after the second etching step. This invention additionally provides any of the prior methods further comprising contacting the silicon substrate with an etchant composition of this invention prior to and/or after the first and/or second etching step.

DETAILED DESCRIPTION OF THE INVENTION

Figure 1:
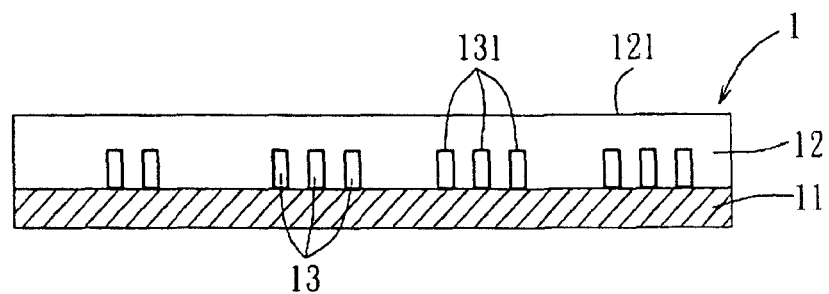
FIG. 1 is an illustration showing the original structure of an unpolished TSV wafer.
Figure 2:
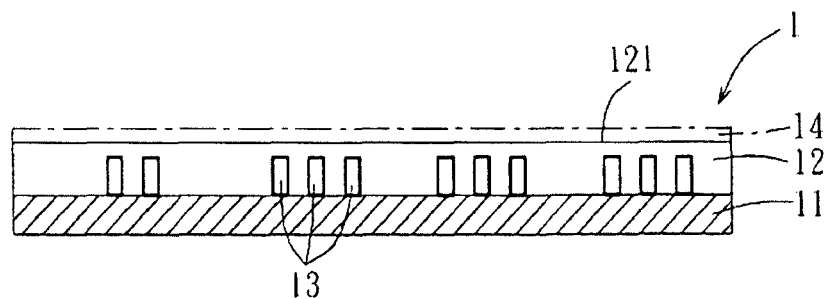
FIG. 2 is an illustration showing the corresponding statuses of each component in a TSV wafer before and after one or more CMP polishing steps.

FIG. 1 shows the original structure of a TSV wafer 1, which comprises an integrated circuit layer 11, a silicon wafer layer 12 arranged on integrated circuit layer 11, and conductive materials 13. Conductive materials 13 are buried in silicon wafer layer 12, are approximately perpendicular to surface 121 of silicon wafer layer 12, and connect to integrated circuit layer 11. Generally, end surfaces 131 of conductive materials 13 in an unpolished TSV wafer are about a couple hundred micrometers from surface 121 of silicon wafer layer 12.

Surface 121 is subsequently polished by grinding, so that silicon wafer layer 12 is rapidly thinned, and thereby the distance between end surfaces 131 of conductive materials 13 and surface 121 of silicon wafer layer 12 is reduced to about tens of micrometers or more.

After grinding and thinning silicon wafer layer 12, by a first CMP polishing step, an optional second CMP polishing step can be performed to fully and further remove layer 14 of the TSV wafer 1.

Figure 3:
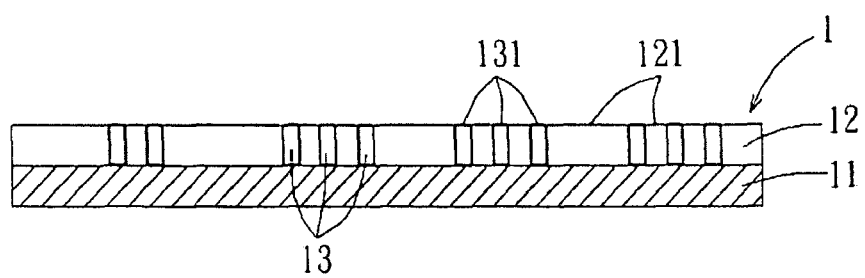
FIGS. 3 and 4 are illustrations that represent the end surfaces of conductive materials after the step of using the composition of this invention to etch the silicon wafer surface after CMP polishing. The conductive materials are coplanar or protruding out of the surface of the silicon wafer layer.
Figure 4:
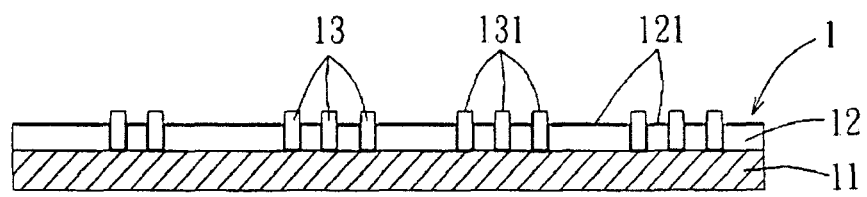

After the CMP polishing step(s), the method of this invention comprises the step of etching the silicon wafer to expose the conductive materials 13. When the wafer (or other silicon substrate) is contacted with the etching composition (a solution) of this invention, the top surface 121 of layer 12 of the silicon wafer above the integrated surface layer 11 is removed until the conductive materials 13 are exposed or nearly exposed. The final status of the finely polished TSV wafer 1 is varied depending upon the requirements for the subsequent processes. For example, end surfaces 131 of the conductive materials 13 and top surface 121 of silicon wafer layer 12 surrounding thereof may be coplanar as shown in FIG. 3, or the end surfaces 131 may be protruding out of top surface 121 as shown in FIG. 4. In some embodiments, the conductive materials 13 may be coated with a silicon dioxide layer or a silicon nitride layer or a titanium nitride layer or a tantalum nitride layer or combinations thereof (not shown) which may be subsequently removed in later processing steps. The surface roughness of the top surface 121 provided by the etchant composition is important whether or not the end surfaces 131 of the conductive materials 13 protrude or are to be coplanar with the top surface. A resulting top surface with high surface roughness after treatment with the etchant composition may make it difficult for a sensor or sensors to detect the end point of the etching step. Further, a resulting top surface with high surface roughness after treatment with the etchant composition may interfere with establishing or maintaining the electrical communication between the conductive materials 13 of the treated wafer and the conductive materials of an adjacent wafer, part of a wafer or packaging when a downstream integrated circuit is constructed using the treated wafer or parts of the treated wafer.

The compositions of this invention may be used in other methods requiring that a silicon layer be etched, particularly when there is silicon dioxide present on or near the same layer and it is preferred that all or most of the silicon dioxide is not removed from the wafer or other substrate at the same time that the silicon is removed using the etchant composition of this invention.

In general, a high silicon etch rate, low silicon dioxide etch rate and low resulting surface roughness of the treated wafer are desireable to maintain a high through-put of treated wafers; however, sometimes depending upon a wafer manufacturer's needs, one or two of those characteristics provided by the etchant composition may be more important than the other(s), meaning for example, a lower etchant rate can be tolerated if the resulting wafer surface roughness is low.

The compositions of this invention that are used in the wet etching step comprises one or more than one inorganic alkali basic hydroxides selected from the group consisting of potassium hydroxide, cesium hydroxide, sodium hydroxide, rubidium hydroxide, or lithium hydroxide, and combinations thereof, for example, potassium hydroxide and cesium hydroxide.

The total amount of the inorganic alkali basic hydroxides present in the composition is typically from 0.5 to 25 weight percent (wt %), or 0.5 to 20 wt %, or 1.0 to 20 wt %, or 2.0 to 16 wt %, or 0.5 to 22 wt %, or 1 to 18 wt %, or 1 to 16 wt %, or 1 to 14 wt %, or 1 to 12 wt %, or 1 to 10 wt %, or 0.5 to 10 wt %, or 1 to 9 wt %, or 1 to 8 wt %, or 1 to 7 wt %, or 1 to 6 wt %, or 1 to 5 wt %, or 1 to 4 wt %, or 4 to 10 wt %, or 5 to 10 wt %, or 5 to 9 wt %, or 5 to 8 wt %, or 6 to 10 wt %, or 7 to 10 wt %, or 8 to 10 wt %, or 5 to 15 wt % based on the total weight of the etchant composition.

Note all weight percentage (wt %) of components reported herein are based on the total weight of the composition. Any use of "one or more" or "two or more" means and can be replaced with "one or more than one" or "two or more than two", respectively. Note that the terms "comprising", "containing" or "having" are all non-limiting, open terms and include the partially closed or closed terms "consisting essentially of" and "consisting of" anywhere those terms are used in the application.

The composition may comprise two or more than two inorganic alkali basic hydroxides. In one embodiment the composition comprises potassium hydroxide and cesium hydroxide. In the embodiment in which a combination of potassium hydroxide and cesium hydroxide is used, it may be preferred to use at least an equal weight percent or a greater weight percent of cesium hydroxide than potassium hydroxide in the composition. In some embodiments, the weight percent of cesium hydroxide will be more than 0.6 times or more than 1.1 times, or more than 2 times, or more than 2.5 times, or more than 5.0 times, or more than 10 times, and/or may be less than about 20 times the weight percent of potassium hydroxide present in the composition. Therefore, in some embodiments, the weight percent of cesium hydroxide may be from more than 0.6 to less than 20 times or 1.1 to less than 20 times, or more than 2.5 to less than 20 times, or more than or more than 5 to less than 20 times, or more than 10 to less than 20 times the weight percent of potassium hydroxide present in the composition. In some embodiments the amount of cesium hydroxide will be 1 to 9.5 wt % and the amount of potassium hydroxide will be 0.1 to 2 wt %. In other embodiments the amount of cesium hydroxide will be 1 to 5 wt % and the amount of potassium hydroxide will be 0.1 to 1.5 wt %. In still other embodiments the amount of cesium hydroxide will be 1 to 5 wt % and the amount of potassium hydroxide will be 0.5 to 1.3 wt %. In still other embodiments the amount of cesium hydroxide will be 1 to 5 wt % and the amount of potassium hydroxide will be 0.7 to 1.2 wt %.

In still other embodiments the ratio of the weight percent of cesium hydroxide to the weight percent of the potassium hydroxide in the etchant composition will be from 1 to 10, or from 2 to 9, or from 3 to 8. These compositions may be desirable when a lower resulting surface roughness of the etched wafer is particularly important.

In the embodiment in which a combination of potassium hydroxide and cesium hydroxide is used, it may be preferred to use at least an equal weight percent or a greater weight percent of potassium hydroxide than cesium hydroxide in the composition. In some embodiments, the weight percent of potassium hydroxide will be more than 1 time, or more than 1.1 times and/or may be less than about 5 times the weight percent of cesium hydroxide present in the composition.

The composition additionally comprises one or more additional alkaline compounds (in addition to the one or more inorganic alkali basic hydroxides). The additional alkaline compounds are preferably non-alkali. The additional one or more alkaline compounds may be selected to provide the desired etch rate(s) and additionally to provide a desirable surface roughness to the etched silicon. Examples of these additional alkaline compounds include alkaline ammonium compounds, such as, ammonium hydroxide ($NH_4OH$) and quaternary ammonium compounds. Quaternary ammonium compounds include tetraalkylammonium hydroxides and tetraalkylammonium fluorides. Exemplary quaternary ammonium hydroxides (and tetraalkylammonium hydroxides) may be those compounds having the formula $[NR^1R^2R^3R^4]^+OH^-$ wherein $R^1$, $R^2$, $R^3$, and $R^4$ are each independently an alkyl group, a hydroxyalkyl group, and combinations thereof. Exemplary quaternary ammonium fluorides (and tetraalkylammonium fluorides) may be those compounds having the formula $[N—R^1R^2R^3R^4]^+F^-$ wherein $R^1$, $R^2$, $R^3$, and $R^4$ are each independently an alkyl group, a fluoroalkyl group, and combinations thereof. The term "alkyl" as used herein refers to straight or branched chain hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The term "hydroxyalkyl" as used herein refers to straight or branched hydroxyl groups containing hydrocarbon groups of from 1 to 20 carbon atoms, or from 1 to 8 carbon atoms, or from 1 to 4 carbon atoms. The term "fluoroalkyl" as used herein refers to straight or branched fluoro groups containing hydrocarbon groups of from 1 to 20 carbon atoms, or from 1 to 8 carbon atoms, or from 1 to 4 carbon atoms. Examples of suitable fluoroalkyl groups include fluoroethyl and fluoropropyl. Examples of suitable quaternary ammonium hydroxide compounds (and tetraalkylammonium hydroxides) include tetramethylammonium hydroxide (TMAH), tetraethylammonium hydroxide (TEAH), tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, choline hydroxide and benzyltrimethylammonium hydroxide (Triton B). Examples of suitable quaternary ammonium fluoride compounds include tetramethylammonium fluoride (TMAF), tetraethylammonium fluoride, tetrabutylammonium fluoride (TBAF), tetrapropylammonium fluoride, trimethylethylammonium fluoride, (2-hydroxyethyl)trimethylammonium fluoride, (2-hydroxyethyl)triethylammonium fluoride, (2-hydroxyethyl)tripropylammonium fluoride, (1-hydroxypropyl)trimethylammonium fluoride, ethyltrimethylammonium fluoride, diethyldimethylammonium fluoride and benzyltrimethylammonium fluoride. Further examples of tetraalkylammonium hydroxides include tetramethylammonium hydroxide (TMAH), tetraethylammonium hydroxide (TEAH), ethyltrimethylammonium hydroxide (ETMAH), dimethyldipropylammonium hydroxide (DMDPAH). The additional alkaline compound may be selected from tetraethylammonium hydroxide (TEAH), ethyltrimethylammonium hydroxide (ETMAH), dimethyldipropylammonium hydroxide (DM-DPAH), tetramethylammonium fluoride (TMAF) and ammonium hydroxide (NH4OH). The additional alkaline compound may be selected from tetraethylammonium hydroxide (TEAH) and ethyltrimethylammonium hydroxide (ETMAH), choline hydroxide and benzyltrimethylammonium hydroxide (Triton B). The etchant composition of this invention may comprise tetraethylammonium hydroxide (TEAH) as the additional alkaline component. The etchant composition of this invention may comprise ethyltrimethylammonium hydroxide (ETMAH), choline hydroxide and/or benzyltrimethylammonium hydroxide (Triton B) as the additional alkaline component. The etchant composition of this invention may comprise ethyltrimethylammonium hydroxide (ETMAH) as the additional alkaline component. With regard to the concentration of the additional alkaline compound in the liquid composition, the additional alkaline compound which may be an alkaline organic compound, may be used in an amount that is from 0.1 to 5 wt %, or 0.2 to 3 wt %, or 0.5 to 2 wt %, based on the total weight of the composition. The concentration of the additional alkaline compound may be present in an amount that is greater than 0.1 wt % but less than 5 wt % based on the total weight of the composition.

In certain embodiments, the ratio of the weight percent of the one or more additional alkaline compounds (for example, such as tetraalkylammonium hydroxides, tetraalkylammonium fluorides, and/or ammonium hydroxide and/or choline hydroxide and/or benzyltrimethylammonium hydroxide (Triton B) to the total weight percent of the one or more inorganic alkali basic hydroxides present in the composition is in the range from 0.05 to 2.0, or from 0.05 to 1.0, or from 0.03 to 0.8, or from 0.05 to 0.8, or from 0.1 to 0.8. Additionally, in embodiments comprising potassium hydroxide and cesium hydroxide, the ratio of the one or more additional alkaline compounds to the total weight of the one or more inorganic alkali basic hydroxides present in some embodiments of the composition may be from 0.05 to 2.0, or from 0.05 to 1.0, or from 0.03 to 0.8, or from 0.05 to 0.8, or from 0.05 to 0.8, or from 0.1 to 0.8.

The composition of this invention further comprises water. The water used in the composition is pure or ultrapure water, such as (de-ionized water) DI water. The composition may comprise any amount of water. For example, water may be present in an amount greater than 70 wt %, or from 70 to 99 wt %, or from 80 to 98 wt %, or from 85 to 98 wt %, or from 88 to 98 wt %, or from 90 to 98 wt %, or from 91 to 97 wt %, or from 92 to 96 wt %, or from 93 to 95 wt %, or greater than 90 wt %, or greater than 92 wt %, or greater than 93.5 wt %, or greater than 94 wt %, or greater than 95 wt % of the composition.

The compositions of this invention may comprise optional ingredients, such as surfactants, and/or oxidizing agents, and/or solvents, and/or corrosion inhibitors.

The compositions of this invention may comprise one or more optional surfactants that may be, for examples, anionic, cationic, nonionic and zwitterionic. Examples of surfactants include dodecyl sulfate sodium salts, sodium lauryl sulfates, dodecyl sulfate ammonium salts, secondary alkane sulfonates (SAS), acetylenic surfactants, alkyl phenol ethoxylates, fatty alcohol ethoxylates, fatty amine ethoxylates, propylene oxide-ethylene oxide block copolymers, or ethylene diamine surfactants, and any combination thereof.

Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals. Suitable surfactants may also include polymers comprising ethylene oxide (EO) and propylene oxide (PO) groups. An example of EO-PO polymer is Tetronic™ 90R4 from BASF Chemicals. Additional examples of some useful surfactants are disclosed in U.S. Pat. No. 7,591,270, incorporated herein by reference. If present, the one or more surfactants may be used in any amount, typically in an amount less than 2 wt %, or from 0.001 to 2 wt % of the total composition.

Additional optional components are one or more oxidizing agents that may be used in the composition of this invention, such as hydrogen peroxide; salts of chlorite, chlorate, or perchlorate; hypochlorite and other hypohalite compounds; chromate and dichromate compounds; permanganate compounds such as potassium permanganate; sodium perborate; and organosulfonic acids. If present, oxidizing agents may be used in any amount, typically in an amount less than 5 wt %, or from 0.001 to 2 wt % of the total composition.

The composition may further comprise one or more optional organic solvents, typically water soluble or water miscible organic solvents. As used herein, water soluble or water miscible organic solvents include solvents that are able to mix with water and each other and form a homogeneous solution at standard operating temperatures and pressures. Examples of water soluble or water miscible organic solvents that may be used include, but are not limited to, ethylene glycol, propylene glycol, dipropylene glycol, 1,4-butanediol, tripropylene glycol methyl ether, tripropylene glycol monobutyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols (e.g. benzyl alcohol), sulfoxides, or mixtures thereof. Preferred optional solvents are alcohols, diols, or mixtures thereof. Preferred optional solvents include glycol ethers or hydric alcohols having 2 to 8 carbon atoms, and mixtures thereof.

Examples of glycol ethers that may be used as the one or more optional solvents in the compositions of this invention include, for example, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, ethylene glycol monomethyl ether acetate, ethylene glycol monoethyl ether acetate, propylene glycol methyl ether acetate, propylene glycol monomethyl ether, propylene glycol dimethyl ether, propylene glycol monobutyl ether, propylene glycol monopropyl ether, dipropylene glycol monomethyl ether, dipropylene glycol monopropyl ether, dipropylene glycol monoisopropyl ether, dipropylene glycol monobutyl ether, dipropylene glycol diisopropyl ether, tripropylene glycol monomethyl ether, tripropylene glycol monobutyl ether, 1-methoxy-2-butanol, 2-methoxy-1-butanol, 2-methoxy-2-methylbutanol, 1,1-dimethoxyethane and 2-(2-butoxyethoxy) ethanol. In an exemplary embodiment, the glycol ether comprises tri(propylene glycol) methyl ether (t-PGME).

One suitable monohydric alcohol having one hydroxy group, 2 to 8 carbon atoms, and optionally, a heterocyclic compound that may be used as the optional organic solvent in the compositions of this invention, includes tetrahydrofufuryl alcohol (THFA). THFA is particularly preferred because it is biodegradable and water-miscible with high solvency. Additionally, THFA is not listed as a carcinogen and is not classified as a hazardous waste. If present, solvents may be used in any amount, typically in an amount less than 5 wt % of the total composition.

The compositions of this invention may optionally further comprise one or more corrosion inhibitors. Such corrosion inhibitors include those well known in the art for similar applications, such as those disclosed in U.S. Pat. No. 5,417,877 which are incorporated herein by reference. Corrosion inhibitors may be, for example, an organic acid, an organic acid salt, a phenol, a triazole, a hydroxylamine or acid salt thereof, or a polyethyleneimine. Examples of particular corrosion inhibitors include anthranilic acid, gallic acid, benzoic acid, isophthalic acid, maleic acid, fumaric acid, D,L-malic acid, malonic acid, phthalic acid, ascorbic acid, maleic anhydride, phthalic anhydride, benzotriazole (BZT), resorcinol, carboxybenzotriazole, diethyl hydroxylamine and the lactic acid and citric acid salts thereof, and the like. Further examples of corrosion inhibitors that may be used include catechol, t-butyl catechol, pyrogallol, and esters of gallic acid. Particular hydroxylamines that can be used include diethylhydroxylamine and the lactic acid and citric acid salts thereof. Yet other examples of suitable corrosion inhibitors include fructose, ammonium thiosulfate, glycine, lactic acid, tetramethylguanidine, iminodiacetic acid, and dimethylacetoacetamide. In certain embodiments, the corrosion inhibitor may include a weak acid having a pH ranging from about 4 to about 7. Examples of weak acids include trihydroxybenzene, dihydroxybenzene, and/or salicylhydroxamic acid. Corrosion inhibitors used in the composition may be selected from the group consisting of catechol, t-butyl catechol, pyrogallol, gallic acid and phenol. Corrosion inhibitors used in the composition may be selected from the group consisting of catechol, t-butyl catechol, and pyrogallol. Corrosion inhibitors used in the composition may be catechol or t-butyl catechol. If present, the corrosion inhibitors may be used in any amount, typically in an amount less than 5 wt % of the total composition.

In some embodiments, the compositions of this invention are substantially free of certain components. "Substantially free of" means that the composition comprises less than 0.05 wt % of a named component or class of components. "Free of" means that the composition comprises less than 0.001% of a named component or class of components. The compositions of this invention may be substantially free of, or free of, one or more or all of the following in any combination: oxidizing agents, and/or organic solvents, and/or corrosion-inhibitors, and/or fluorine-containing components, and/or quaternary ammonium hydroxides, and/or alkanolamines, and/or hydroxyalmines, and/or surfactants, and/or chelating agents and/or biocides and/or thionites and/or sulfites and/or sulfates and/or polymers. Some embodiments of this invention may be substantially free of, or free of, oxidizing agents, and corrosion-inhibitors, and alkanolamines, and hydroxylamines, and surfactants, and chelating agents and/or thionites, sulfites, sulfates and polymers. Some embodiments of this invention may be substantially free of, or free of, oxidizing agents, corrosion-inhibitors, alkanolamines, hydroxylamines, surfactants, chelating agents, and fluorine-containing components and/or thionites, sulfites, sulfates and polymers. Some embodiments of this invention may be substantially free of, or free of, oxidizing agents, corrosion-inhibitors, alkanolamines, hydroxylamines, surfactants, chelating agents, fluorine-containing components, and quaternary ammonium hydroxides. Some embodiments of this invention may be substantially free of, or free of, oxidizing agents, alkanolamines, hydroxylamines, surfactants, chelating agents and fluorine-containing components. Some embodiments of this invention may be substantially free of, or free of, oxidizing agents, alkanolamines, hydroxylamines, surfactants, chelating agents, fluorine-containing components, and quaternary ammonium hydroxides. Some embodiments of this invention may be substantially free of, or free of, oxidizing agents, corrosion-inhibitors, alkanolamines, hydroxylamines, surfactants, chelating agents and fluorine-containing components. Any of the preceding lists may also include organic solvents therein as a component that the composition of this invention is free of or substantially free of.

In the method of using the etchant, typically the etchant is applied only to the surface of the wafer that needs to be etched. Alternatively, if the etchant composition is to be applied in a specific area or areas on the wafer surface, then a lithographic process employing a photoresist may be used to define and expose only the areas on the wafer surface where etching is desired and the etchant solution of this invention shall contact the silicon wafer surface only in those areas. The etchant is typically used at a temperature between between 25 and 100° C., or 25 and 90° C., in many embodiments approximately 70° C. In some embodiments, it may be desirable to pre-treat the wafer, for example, as described in the examples below. In other embodiments, no pretreatment is performed, before the wafer is contacted with the etchant composition of this invention.

It may be desired that the compositions of this invention provide an Si etch amount that is greater than 0.7 µm/min, or greater than 0.8 µm/min. Further, it may be desired that the compositions of this invention provide an SiO2 etch rate that is less than 0.0006 µm/min, or less than 0.0005 µm/min or less than 0.0004 µm/min. It may also be desired that the compositions of this invention provide an Si etch to SiO2 etch ratio of greater than 500 or greater than 800 or greater than 1250 or greater than 1500 or greater than 1700 or greater than 1850 or greater than 2000.

WORKING EXAMPLES

The following examples are provided for the purpose of further illustrating the present invention but are in no way to be taken as limiting. Unless otherwise noted, all amounts are expressed in weight percent (wt %) based on the total weight of the composition.

TEST Method to Determine the Si Etch Rate:

Each etchant composition tested was heated to 70° C. Blank (unpatterned) p-type Si wafer segments 3.5"×5" in size were cleaved from a whole wafer with exposed [1,0,0] crystal face. The Si segments were pre-treated with buffered oxide etch (BOE) at an ambient temperature of approximately 22° C. for 3 minutes to remove native surface oxide, rinsed in deionized water (DIW) for 3 minutes and dried with a nitrogen ($N_2$) gun. Si segments were then weighed on a balance with 5 decimal places for an accurate recording of the weight. The Si segments were then immersed into the etchant for a specific amount of time, removed and rinsed in deionized water (DIW) for 3 minutes, dried with $N_2$, then weighed. The initial and final thicknesses were determined by assuming a Si density of 2.33 gm/cm$^3$ and from the area of the 3.5 cm×5.0 cm segment. Etch rates in pm/min were calculated from the thickness change during the etch experiment. This method was repeated to determine the Si etch rates for the compositions reported in the tables below. (Note: The etch rates as reported are as described for the wafer segments with two exposed sides, each approximately 3.5"×5", and the edges. To estimate the Si etch rate for the use of the etchant compositions of this invention to treat a single side of a Si wafer, (for example, if the compositions are used in a single wafer tool (SWT) etching process), divide the etch rate values reported in the tables herein by 1.7. The 1.7 number was determined by comparing the results using Comparative Example 20F, to the values reported by http://www.lelandstanfordjunior.com/KOHcalc-faq.html at 70° C. using the same composition but only treating one side of the silicon wafer. Dividing the results in Tables 1-7 below by 1.7 provides the expected etch rate for SWT applications using the same etchant composition.)

Test Method to Determine the SiO$_2$ Etch Rate:

1"×1" segment of thermally grown SiO$_2$ on Si wafer (referred to herein as "TOx Segment") was cleaved and its thickness measured using a Filmtek ellipsometer prior to immersion in the etchant solution (time=0 min). About 300 gms of etchant solution was placed in a 500 ml beaker, stirred at 400 rpm, and heated to 70° C. The TOx segment was placed into the heated etchant solution for 10 minutes (time=10 minutes), removed and rinsed with DIW, then dried with N2. The thickness was remeasured with the Filmtek. The same TOx Segment was re-immersed into the heated etchant for an additional 10 minutes (time=20 minutes) removed and rinsed with DIW, then dried with N$_2$. The thickness was remeasured with the Filmtek. This process was repeated at time=40 minutes and time=60 mins. The SiO$_2$ etch rate was determined by averaging the measured change in thickness versus time (the 4 data points measured). This method was used to measure the SiO$_2$ etch rates for the compositions reported in the tables below.

Composition for Comparative Example 1

An etchant solution was prepared by adding 41.7 gms of 48 wt % KOH solution from Aldrich Chemical, i.e. 20.0 gms of KOH, to deionized water in an HDPE bottle and making up to 1000 gms. (The KOH was the inorganic alkali basic hydroxide in the etchant.) The solution was stirred to completely mix the KOH solution and had a pH of 13.05. About 300 gms of the solution was placed into a 500 ml beaker and strirred at 900 rpm with 1" stir bar, then heated to, and equilibriated, at 70° C. while stirring. p-type Si wafers from LG Siltron with resistivity in the range of 1 to 35 Ohm-cm were used in this test. Two p-type Si wafer segments were cleaved from Siltron wafers, pretreated and weighed. One segment was immersed for 10 minutes and the second segment for 60 minutes, each was removed and rinsed with DIW for 3 mins, and dried. The segments were then re-weighed after drying. This etchant gave a Si etch rate of 0.99 μm/min (calculated from the two weight measurements), an SiO$_2$ etch rate of 0.00091 μm/min, and Si/SiO$_2$ selectivity ratio of 1088.

Compositions for Examples 1-4

Etchant solutions were prepared as in Comparative Example 1 except that the weight percents of KOH, as the inorganic alkali basic hydroxide, and tetraethylammonium hydroxide (TEAH), as the additional alkaline compound, and deionized water used to make each 1000 gm composition were as indicated in Table 1 below. (The TEAH was obtained as a 50 wt % solution in water from Sachem.) The solutions were stirred to completely mix the solutions. The same tests described for Comparative Example 1 were repeated using the Example 1-4 compositions. The Si etch rate, the SiO$_2$ etch rate and the Si/SiO$_2$ etch rate ratio measured and calculated as described above using each of the Example 1-4 compositions are listed in Table 1.

Examples 5-7

An etchant solution was prepared as described for Examples 1-4 above, except that the component weight percentages that are in Table 1 were used and the compositions further included adding cesium hydroxide (CsOH) to the KOH, tetraethylammonium hydroxide (TEAH) and deionized water in a HDPE bottle to make 1000 gms of each of the compositions. (The CsOH was obtained as a 50 wt % solution in water from Aldrich.) The Si etch rate, the SiO$_2$ etch rate and the Si/SiO$_2$ etch rate ratio for each of the compositions of Examples 5-7 were determined as described above and are listed in Table 1.

Example 8

An etchant solution was prepared as described for Example 1 above, except that 1.0 gm of Pluronic® L31 a difunctional block copolymer surfactant terminating in primary hydroxyl groups was added to the composition and the amount of water therein was adjusted accordingly. (Pluronic is a registered trademark of BASF Corporation.) The Si etch rate, the SiO$_2$ etch rate and the Si/SiO$_2$ etch rate ratio for Example 8 were determined as described above and are listed in Table 1.

TABLE 1

| Composition No. | inorganic alkali basic hydroxide KOH (wt %) | inorganic alkali basic hydroxide CsOH (wt %) | additional alkaline compound TEAH (wt %) | DI water (wt %) | surfactant (wt %) | Si etch rate (μm/min) | SiO$_2$ etch rate (μm/min) | Si/SiO$_2$ etch rate |
|---|---|---|---|---|---|---|---|---|
| Comparative Ex. 1 | 2 | 0 | 0 | 98 | 0 | 0.99 | 0.00091 | 1088 |
| 1 | 2 | 0 | 2.62 | 95.38 | 0 | 0.804 | 0.00059 | 1363 |
| 2 | 2 | 0 | 5.24 | 92.76 | 0 | 0.774 | 0.00067 | 1155 |

TABLE 1-continued

| Composition No. | inorganic alkali basic hydroxide KOH (wt %) | inorganic alkali basic hydroxide CsOH (wt %) | additional alkaline compound TEAH (wt %) | DI water (wt %) | surfactant (wt %) | Si etch rate (μm/min) | $SiO_2$ etch rate (μm/min) | $Si/SiO_2$ etch rate |
|---|---|---|---|---|---|---|---|---|
| 3 | 2 | 0 | 7.86 | 90.14 | 0 | 0.581 | 0.00116 | 501 |
| 4 | 1 | 0 | 0.79 | 98.21 | 0 | 0.789 | 0.00048 | 1644 |
| 5 | 2 | 1.33 | 2.62 | 94.05 | 0 | 0.81 | 0.00064 | 1266 |
| 6 | 1 | 2.67 | 2.62 | 93.71 | 0 | 0.83 | 0.00033 | 2515 |
| 7 | 1 | 1.33 | 1.31 | 96.36 | 0 | 0.83 | 0.00047 | 1766 |
| 8 | 2 | 0 | 2.62 | 95.28 | 0.1 | 0.123 | 0.00078 | 158 |

The following tests were performed to test additional components, including the addition of lithium hydroxide, an inorganic alkali basic hydroxide, to the etchant composition.

Examples 15-24

Etchant solutions were prepared as described in Example 1 except that the additional alkaline compounds listed in Table 2 were used in the amounts indicated in Table 2 in the etchant compositions. Table 2 also indicates the amount of KOH and water used for each of the etchant compositions. In the examples in the Table 2, tetramethylammonium fluoride (TMAF), ammonium hydroxide ($NH_4OH$), lithium hydroxide (LiOH), potassium chloride (KCl), lanthanum acetate (La Acetate) and barium chloride ($BaCl_2$) were added to the compositions in the weight percents indicated in Table 2.

P-type Si wafers obtained from WRS Materials with resistivity in the range of 18 to 34 Ohm-cm were used in this test in which 4 wafer segments were simultaneously immersed into each etchant solution for 60 minutes. The measured Si etch rate for each etchant solution (averaged for the 4 wafer segments tested for each composition) is listed in Table 2.

TABLE 2

| Composition No. | inorganic alkali basic hydroxide KOH (wt %) | inorganic alkali basic hydroxide CsOH (wt %) | additional alkaline compound | amount of additional alkaline compound (wt %) | DI water (wt %) | Si etch rate (um/min) |
|---|---|---|---|---|---|---|
| 15 | 2 | 0 | TMAF | 0.83 | 97.17 | 0.98 |
| 16 | 2 | 0 | TMAF | 1.66 | 96.34 | 1.19 |
| 17 | 2 | 0 | TMAF | 3.32 | 94.68 | 0.98 |
| 18 | 2 | 0 | $NH_4OH$ | 0.31 | 97.69 | 1.10 |
| 19 | 2 | 0 | $NH_4OH$ | 0.62 | 97.38 | 0.96 |
| 20 | 2 | 0 | $NH_4OH$ | 1.24 | 96.76 | 1.08 |
| 21 | 2 | LiOH* 4.3 | | | 93.7 | 0.758 |
| 22 | 2 | 0 | KCl | 1.33 | 96.67 | 0.506 |
| 23 | 2 | 0 | La Acetate | 1.88 | 96.12 | 0.650 |
| 24 | 2 | 0 | $BaCl_2$ | 1.86 | 96.14 | <0 |

*LiOH was used in this composition instead of CsOH.

The following tests were performed to show the effect of the etching compositions of this invention on the surface roughness of the silicon wafers tested. Etching compositions were prepared as described in the examples above, the components and their corresponding weight percents are listed in Table 3. Etched wafer samples were prepared by immersing wafer segments for 10 minutes in the etching compositions as described in Comparative Example 1. The surface roughness of the wafer segments were analyzed as follows. Atomic force microscopy (AFM) was performed using a Digital Instruments Dimension 3000 interfaced to a Nanoscope IIIa controller. All measurements were obtained in tapping mode (0.3-0.5 Hz scan rate) with single cantilever etched silicon SPM probes (Bruker, NCHV). The scan area used was 40 μm×40 μm. Topographic images were captured from which the surface roughness was calculated. Root-mean-square (RMS) values calculated using the generalized formula shown in the "Scanning Probe Microscopy Training Notebook, Digital Instruments", Veeco Metrology Group, 2000, Version 3.0, 004-130-000 (standard issue)/004-130-100 (cleanroom issue) for each imaged area.

The measured surface roughness values are shown together in Table 3. One location was analyzed on each sample, in a location that appeared to be clean and free from large residues.

TABLE 3

| Composition No. | inorganic alkali basic hydroxide KOH (wt %) | inorganic alkali basic hydroxide CsOH (wt %) | additional alkaline compound TEAH (wt %) | DI water (wt %) | Location | Surface Roughness (nm) |
|---|---|---|---|---|---|---|
| 25 | 10 | 0 | 2.62 | 63.8 | 1 | 36.4 |
| 1 | 2 | 0 | 2.62 | 95.38 | 1 | 33.6 |
| 1 | 2 | 0 | 2.62 | 95.38 | 2 | 32.5 |
| 6 | 1 | 2.67 | 2.62 | 93.71 | 1 | 115 |
| 6 | 1 | 2.67 | 2.62 | 93.71 | 2 | 116 |
| 5 | 2 | 1.33 | 2.62 | 94.05 | 1 | 36.6 |
| 5 | 2 | 1.33 | 2.62 | 94.05 | 2 | 45.9 |

Examples 35A to 35M of the invention are shown below in Table 4.

The test method described above for Comparative Example 1 was used, except that a single segment was immersed for 10 minutes and the compositions in the Table below were used.

| Composition No. | inorganic alkali basic hydroxide KOH (wt %) | inorganic alkali basic hydroxide CsOH (wt %) | additional alkaline compound TMAH (wt %) | additional alkaline compound TEAH (wt %) | DIW (wt %) | Si etch rate (um/min) | SiO2 etch rate (um/min) | Si/SiO2 etch Selectivity |
|---|---|---|---|---|---|---|---|---|
| 35A | 0 | 1 | 5 | 0 | 94 | 0.955 | 0.00021 | 4548 |
| 35B | 0 | 10 | 5 | 0 | 85 | 0.939 | 0.00014 | 6707 |
| 35C | 1 | 0 | 5 | 0 | 94 | 0.940 | 0.00069 | 1362 |
| 35D | 0.37 | 0 | 5 | 0 | 94.63 | 0.952 | 0.00035 | 2720 |
| 35E | 3.74 | 0 | 5 | 0 | 91.26 | 0.900 | 0.000116 | 776 |
| 35F | 2.0 | 4.65 | 5 | 0 | 88.35 | 0.968 | 0.00051 | 1898 |
| 35G | 2.0 | 4.65 | 0 | 5 | 88.35 | 0.815 | 0.00053 | 1538 |
| 35H | 1.0 | 7.32 | 0 | 5 | 86.68 | 0.810 | 0.00037 | 2189 |
| 35I | 1.0 | 7.32 | 5 | 0 | 86.68 | 1.02* | 0.00033 | 3412* |
| 35J | 1.0 | 7.32 | 0 | 0.5 | 91.18 | 1.07* | 0.0003 | 3573* |
| 35K | 0 | 7.32 | 5 | 0 | 87.68 | 0.998 | — | — |
| 35L | 1.0 | 7.32 | 0 | 0 | 91.68 | 1.23 | — | — |
| 35M | 1.0 | 7.32 | 0 | 0.26** ETMOH | 91.32 | 1.14 | 0.00031 | 3677 |

*Test repeated 3 times and the results averaged.
**TEAH was replaced with ETMOH at the same molar concentration in this test.

Additional Examples of the invention are shown below in Table 5.

The test method described above for Comparative Example 1 was used, except that the compositions in the Table below were used. The Si etch rate, the SiO$_2$ etch rate and the Si/SiO$_2$ etch rate ratio for each of the compositions were determined as described above and are listed below in the table.

| Composition No. | inorganic alkali basic hydroxide KOH (wt %) | inorganic alkali basic hydroxide CsOH (wt %) | wt % additional TEAH alkaline compound | Catechol (wt %) | DIW (wt %) | Si etch rate (um/min) | SiO2 etch rate (um/min) × 1000 | Si/SiO2 etch Selectivity |
|---|---|---|---|---|---|---|---|---|
| 35N* | 0.80 | 2.15 | 0.55 | | 96.50 | 0.69 | 0.00041 | 1683 |
| 35O* | 1.51 | 3.20 | 1.01 | | 94.28 | 0.79 | 0.00044 | 1795 |
| 35P* | 1.00 | 7.32 | 1.00 | | 90.68 | 0.94 | 0.00029 | 3241 |
| 35Q* | 2.00 | 4.65 | 1.00 | | 92.35 | 1.03 | 0.00048 | 2146 |
| 35R* | 2.00 | 4.65 | 2.00 | | 91.35 | 0.64 | 0.00047 | 1362 |
| 20F** | 10.00 | 0 | 0 | | 90.00 | 1.23 | N/A | |
| 20F** | 10.00 | 0 | 0 | | 90.00 | 1.32 | N/A | |
| 20F** | 10.00 | 0 | 0 | | 90.00 | 1.37 | N/A | |
| 20D** | 2.00 | 0 | 0 | | 98.00 | 0.87 | N/A | |
| 20E** | 5.00 | 0 | 0 | | 95.00 | 1.02 | N/A | |

*WRS Si wafer
**Siltronic Si wafer

Additional examples of the invention are shown below in Table 6.

The test method described above for Comparative Example 1 was used except that the compositions described in the table below were used. The Si etch rate, the SiO$_2$ etch rate and the Si/SiO$_2$ etch rate ratio for each of the compositions were determined as described above and are listed below in the table. The surface roughness was determined based on SEMs that were taken. After immersion the Si wafer substrates were rinsed with DI water for 3 minutes at ambient and dried with Nitrogen. The treated substrates were photographed using an SEM at 2 kV acceleration voltage and 2 k and 10 magnification. The SEM photographs were then visually inspected and rated using the following ratings:

√√√√=smooth surface and/or few small Si crystallites here and there on surface.

√√√=small Si crystallites covering most of surface and/or few medium crystallites.

√√=either few large or many medium size Si crystallites.

√=large Si crystallites over much of the surface.

| Composition No. | inorganic alkali basic hydroxide KOH (wt %) | inorganic alkali basic hydroxide CsOH (wt %) | 1.0 wt % additional alkaline compound | Catechol (wt %) | DIW (wt %) | Si etch rate (um/min) | SiO2 etch rate (um/min) × 1000 | Si/SiO2 etch Selectivity | Surface Roughness |
|---|---|---|---|---|---|---|---|---|---|
| 35S | 5.35 | 4.65 | TEAH | 0 | 89.00 | 1.22 | 0.00065 | 1877 | |
| 35S | 5.35 | 4.65 | TEAH | 0 | 89.00 | 1.14 | 0.00065 | 1754 | |
| 35S | 5.35 | 4.65 | TEAH | 0 | 89.00 | 1.22 | 0.00084 | 1452 | ✓✓ |
| 35S | 5.35 | 4.65 | TEAH | 0 | 89.00 | 1.09 | 0.00084 | 1298 | ✓✓ |
| 52A | 5.35 | 4.65 | TEAH | 1.0 | 88.00 | 1.21 | 0.00103 | 1174 | ✓✓✓ |
| 52A | 5.35 | 4.65 | TEAH | 1.0 | 88.00 | 1.15 | N/A | | |
| 52A | 5.35 | 4.65 | TEAH | 1.0 | 88.00 | 0.99 | N/A | | |
| 52A | 5.35 | 4.65 | TEAH | 1.0 | 88.00 | 1.28 | N/A | | |
| 52A | 5.35 | 4.65 | TEAH | 1.0 | 88.00 | 1.01 | N/A | | |
| 52B | 5.35 | 4.65 | TEAH | 2.0 | 87.00 | 1.12 | N/A | | ✓✓ |
| 52C | 5.35 | 4.65 | TEAH | 4.0 | 85.00 | 1.01 | 0.00113 | | ✓ |
| 52G | 5.35 | 4.65 | TEAH | 0.25 | 88.75 | 1.33 | N/A | | ✓✓✓ |
| 52H | 5.35 | 4.65 | TEAH | 0.50 | 88.50 | 1.23 | N/A | | ✓✓✓ |

Additional examples of the invention are shown below in Table 7.

The test method described above for Comparative Example 1 was used except that the compositions in the table below were used. The etch rates and the Surface Roughness were determined in the same way as described above.

| Composition No. | inorganic alkali basic hydroxide KOH (wt %) | inorganic alkali basic hydroxide CsOH (wt %) | 1.0 wt % additional alkaline compound | Catechol (wt %) | DIW (wt %) | Si etch rate (um/min) | SiO2 etch rate (um/min) | Si/SiO2 etch Selectivity | Surface Roughness |
|---|---|---|---|---|---|---|---|---|---|
| 35S | 5.35 | 4.65 | TEAH | 0 | 89.00 | | | | |
| 52A | 5.35 | 4.65 | TEAH | 1.0 | 88.00 | 1.21 | 0.00103 | 1175 | ✓✓✓ |
| 52A | 5.35 | 4.65 | TEAH | 1.0 | 88.00 | 1.15 | N/A | | |
| 52A | 5.35 | 4.65 | TEAH | 1.0 | 88.00 | 0.99 | N/A | | |
| 52A | 5.35 | 4.65 | TEAH | 1.0 | 88.00 | 1.28 | N/A | | |
| 52A | 5.35 | 4.65 | TEAH | 1.0 | 88.00 | 1.01 | N/A | | |
| 52I | 5.35 | 4.65 | Choline Hydroxide | 1.0 | 88.00 | 1.61 | 0.0008 | 2013 | |
| 52I | 5.35 | 4.65 | Choline Hydroxide | 1.0 | 88.00 | 1.85 | N/A | | ✓ |
| 52J | 5.35 | 4.65 | ETMOH | 1.0 | 88.00 | 1.66 | 0.00093 | 1785 | |
| 52J | 5.35 | 4.65 | ETMOH | 1.0 | 88.00 | 1.21** | N/A | | |
| 52J | 5.35 | 4.65 | ETMOH | 1.0 | 88.00 | 2.09 | N/A | | ✓✓ |
| 52K | 5.35 | 4.65 | Triton B | 1.0 | 88.00 | 1.15 | N/A | | ✓+ |
| 52J | 5.35 | 4.65 | ETMOH | 1.0 | 88.00 | 1.91 | N/A | | |
| 52J | 5.35 | 4.65 | ETMOH | 1.0 | 88.00 | 1.72 | N/A | | |
| 52J | 5.35 | 4.65 | ETMOH | 1.0 | 88.00 | 1.89 | N/A | | |

*Used segments from SVMI Si wafer
**52J was repeated 3X again, because it was believed that an error was made.

Examples EE to FF of the invention are shown below in Table 8.

The test method described above for Comparative Example 1 was used except that SAS-10 was added to some of the examples. SAS-10 is a 10% solution of secondary alkane sulfonates.

| Composition No. | inorganic alkali basic hydroxide KOH (wt %) | inorganic alkali basic hydroxide CsOH (wt %) | TEAH additional alkaline compound (wt %) | SAS-10 Surfactant Additive (wt %) | DIW (wt %) | Si etch rate (um/min) |
|---|---|---|---|---|---|---|
| 35S | 5.35 | 4.65 | 1.0 | 0 | 89.00 | |
| 52D | 5.35 | 4.65 | 1.0 | 0.05 | 88.95 | 0.31 |
| 52E | 5.35 | 4.65 | 1.0 | 0.10 | 88.90 | 0.32 |
| 52F | 5.35 | 4.65 | 1.0 | 0.50 | 88.50 | 0.50 |

The invention claimed is:
1. An etching composition consisting essentially of:
  potassium hydroxide;
  one or more than one additional alkaline compounds selected from the group consisting of TEAH and TMAF; and water;
wherein the composition preferentially etches silicon present on a substrate as compared to silicon dioxide present on said substrate and provides a silicon etch to silicon dioxide etch ratio of greater than 500.

2. An etching composition comprising:
two or more than two inorganic alkali basic hydroxides selected from the group consisting of potassium hydroxide, cesium hydroxide, rubidium hydroxide, and lithium hydroxide;
optionally one or more than one additional alkaline compounds;
optionally one or more corrosion inhibitors; and
water;
wherein the composition preferentially etches silicon present on a substrate as compared to silicon dioxide present on said substrate.

3. The etchant composition of claim 1 wherein the one or more additional alkaline compounds are present in the composition in an amount that is greater than 0.1 wt % but less than 5 wt % based on the total weight of the composition.

4. The etchant composition of claim 2 wherein the two or more than two inorganic alkali basic hydroxides comprise potassium hydroxide and cesium hydroxide.

5. The etchant composition of claim 2 wherein the two or more than two inorganic alkali basic hydroxides comprise potassium hydroxide and lithium hydroxide.

6. The etchant composition of claim 2 wherein the one or more than one additional alkaline compounds are present in the composition and are selected from the group consisting of one or more quaternary ammonium hydroxides, quaternary ammonium fluorides or ammonium hydroxide (NH$_4$OH).

7. The etchant composition of claim 2 wherein the one or more than one additional alkaline compound are present in the composition and are selected from the group consisting of tetramethylammonium hydroxide (TMAH), tetraethylammonium hydroxide (TEAH), tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide (ETMAH), diethyldimethylammonium hydroxide, benzyltrimethylammonium hydroxide, choline hydroxide, tetramethylammonium fluoride (TMAF), tetraethylammonium fluoride, tetrabutylammonium fluoride (TBAF), tetrapropylammonium fluoride, trimethylethylammonium fluoride, (2-hydroxyethyl)trimethylammonium fluoride, (2-hydroxyethyl)triethylammonium fluoride, (2-hydroxyethyl)tripropylammonium fluoride, (1-hydroxypropyl)trimethylammonium fluoride, ethyltrimethylammonium fluoride, diethyldimethylammonium fluoride and benzyltrimethylammonium fluoride.

8. The etchant composition of claim 2 wherein the one or more than one additional alkaline compounds are present in the composition and selected from the group consisting of tetramethyl ammonium hydroxide (TMAH), tetraethylammonium hydroxide (TEAH), ethyltrimethylammonium hydroxide (ETMAH), dimethyldipropylammonium hydroxide (DMDPAH), tetramethylammonium fluoride (TMAF), choline hydroxide and benzyltrimethylammonium hydroxide.

9. The etchant composition of claim 2 wherein the one or more than one additional alkaline compounds are present in the composition and are selected from the group consisting of tetraethylammonium hydroxide (TEAH), ethyltrimethylammonium hydroxide (ETMAH), dimethyldipropylammonium hydroxide (DMDPAH), tetramethylammonium fluoride (TMAF) ammonium hydroxide (NH$_4$OH), choline hydroxide and benzyltrimethylammonium hydroxide.

10. The etchant composition of claim 2 wherein the one or more than one additional alkaline compounds are present in the composition and are selected from tetraethylammonium hydroxide (TEAH), ethyltrimethylammonium hydroxide (ETMAH), dimethyldipropylammonium hydroxide (DMDPAH), choline hydroxide and benzyltrimethylammonium hydroxide.

11. The etchant composition of claim 2 wherein the two or more than two inorganic alkali basic hydroxides are present in a total amount of from 0.5 to 25 wt % of the total composition.

12. The etchant composition of claim 2 wherein the two or more than two inorganic alkali basic hydroxides are present in a total amount of from 1 to 20 wt % of the total composition.

13. The etchant composition of claim 2 wherein the one or more corrosion inhibitors are present in the composition and the one or more corrosion inhibitors are selected from the group consisting of anthranilic acid, gallic acid, benzoic acid, isophthalic acid, maleic acid, fumaric acid, D,L-malic acid, malonic acid, phthalic acid, ascorbic acid, maleic anhydride, phthalic anhydride, benzotriazole (BZT), resorcinol, carboxybenzotriazole, lactic acid, citric acid, catechol, t-butyl catechol, pyrogallol, esters of gallic acid, phenol, glycine, tetramethylguanidine, iminodiacetic acid, and dimethylacetoacetamide, trihydroxybenzene, dihydroxybenzene, and salicylhydroxamic acid.

14. The etchant composition of claim 2 wherein the one or more corrosion inhibitors are present in the composition and the one or more corrosion inhibitors are selected from the group consisting of catechol, t-butyl catechol, pyrogallol, gallic acid and phenol.

15. The etchant composition of claim 2 wherein the one or more corrosion inhibitors are present in the composition and the one or more corrosion inhibitors are selected from the group consisting of catechol and t-butyl catechol.

16. The etchant composition of claim 2 wherein the one or more than one additional alkaline compounds are present in the composition from 0.1 to 5 wt %.

17. The etchant composition of claim 11 wherein the one or more than one additional alkaline compounds are present in the composition from 0.2 to 3 wt %.

18. The etchant composition of claim 16 wherein the composition comprises from 70 to 99 wt % water based on the total weight of the composition.

19. The etchant composition of claim 2 wherein the composition comprises from 80 to 98 wt % water based on the total weight of the composition.

20. The etchant composition of claim 2 wherein the composition is substantially free or free of one or more or all of the following: surfactants, chelating agents, oxidizing agents, solvents and biocides.

21. A method of producing a silicon substrate, the method comprising: forming a silicon dioxide film on a silicon substrate, said silicon dioxide film having at least one opening in said silicon dioxide film on at least one surface of the silicon substrate; a first etching step for etching the silicon substrate at the at least one opening by using the composition of claim 2 whereby said silicon dioxide film acts as a mask, wherein said first etching step is used to form a through silicon via.

22. The method of claim 21 further comprising the step of layering a titanium nitride film on the silicon dioxide film, said titanium nitride film also formed with at least one opening, at least one of said at least one titanium nitride opening and at least one of said at least one silicon dioxide opening being aligned.

23. The method of claim 21 further comprising prior to the first etching step, a second etching step to form one or more holes in said silicon substrate wherein said one or more holes do not protrude through the surface of the silicon substrate; and wherein during said first etching step said one or more holes are aligned with the at least one opening in said silicon dioxide film formed on said silicon substrate.

24. A method according to claim 21 further comprising the step of filling the one or more holes with copper before or after the first etching step or after the second etching step.

* * * * *